United States Patent [19]

Nishimoto

[11] Patent Number: 4,984,991
[45] Date of Patent: Jan. 15, 1991

[54] IC SOCKET

[75] Inventor: Masato Nishimoto, Yokohama, Japan

[73] Assignee: Yamaichi Electric Mfg. Co., Ltd., Tokyo, Japan

[21] Appl. No.: 496,208

[22] Filed: Mar. 20, 1990

[30] Foreign Application Priority Data

Mar. 22, 1989 [JP] Japan .................................. 1-70960

[51] Int. Cl.⁵ .............................................. H05K 1/00
[52] U.S. Cl. ...................................... 439/72; 439/70; 439/525
[58] Field of Search ...................... 439/68, 69, 70, 71, 439/72, 73, 330, 331, 525, 152, 153, 157, 159, 160, 372

[56] References Cited

U.S. PATENT DOCUMENTS

| | | | |
|---|---|---|---|
| 4,498,047 | 2/1985 | Hexamer et al. | 439/152 |
| 4,832,610 | 5/1989 | Matsuoka | 439/159 |
| 4,846,703 | 7/1989 | Matsuoka et al. | 439/71 |
| 4,865,554 | 9/1989 | Matsuoka et al. | 439/152 |
| 4,887,969 | 12/1989 | Abe | 439/73 |

FOREIGN PATENT DOCUMENTS 58-30295   2/1983   Japan ..................................... 439/73
63-288733  11/1988  Japan .

*Primary Examiner*—David L. Pirlot
*Assistant Examiner*—Julie R. Daulton
*Attorney, Agent, or Firm*—Wenderoth, Lind & Ponack

[57] ABSTRACT

An IC socket has a socket board having a plurality of contacts for contacting IC leads, and IC accommodating portion formed in a central portion thereof, and an IC supporting platform adapted to support an IC package thereon and disposed in the accommodating portion so as to be movable in an upward and downward direction. The contacts are formed in parallel along opposing sides of the supporting platform. A plurality of grooves for positioning the contacts are formed in parallel in opposing sides of the IC supporting platform. Contacting portions of resilient contacting pieces of the contacts are received in the positioning grooves. The resilient contacting pieces are regulated by partition walls defining the positioning grooves. The IC socket is characterized in that among the partition wall groups formed on four sides, one portion of partition wall groups of at least two opposite sides are interconnected at free ends of the partition walls. The connecting portions function as pressing portions for moving the IC supporting platform downward and the other partition walls are left in a non-interconnected state.

2 Claims, 4 Drawing Sheets

IC SOCKET

BACKGROUND OF THE INVENTION

1. Field of the Invention

This invention relates to an improved IC socket for obtaining a resilient contacts formed on a socket board while supporting an IC package on a floating type of IC supporting platform mounted on the socket board.

2. Prior Art

In Japanese Patent Early Laid-open Publication No. Sho 63-288733, an IC supporting stage of platform for supporting an IC package thereon is disposed to be movable in a vertical direction at an IC accommodating portion of a socket board having contacts for contacting IC leads, the contacts being formed in parallel along opposing sides of the IC supporting platform. Contact positioning grooves are formed in parallel along opposing sides of the IC supporting platform, and contacting portions of resilient contacting pieces of the contacts are received in the positioning grooves. The resilient contacting pieces are regulated by partition walls for defining the positioning grooves. By moving the IC supporting platform downward, the IC leads are urged against the contacting portions to bend the resilient contacting pieces in a direction against the resiliency and to obtain a pressure contact by a restoring force thereof.

However, if a pressing cover is provided to effect a means for pressing means, and the IC supporting platform is lowered by directly pressing the leads of the IC package on the IC supporting platform with a pressing portion formed on the socket board by closing the pressing cover to the socket board, there is a fear that deformation of the leads is possible.

In order to overcome this problem, all of the partition walls formed in parallel on each side of the IC supporting platform are interconnected at free ends thereof, and by pressing the connecting portions with the pressing cover, a pressing force is directly exerted to the IC supporting platform to move it downward and the IC leads are also pressed. However, in this arrangement, problems such as poor molding results due to its structure and distortion generated at the connecting portions, the contacting portions of all the contacts must be held in alignment with the groove groups, and assembling performance is very bad.

The present invention has been accomplished in order to overcome the above-mentioned problems.

SUMMARY OF THE INVENTION

To solve the above-mentioned problems, according to the present invention, there is provided an IC socket having an IC supporting platform provided with partition walls, one portion of the partition walls of at least two opposing sides of the IC supporting platform among the partition walls formed on each and every side being interconnected at free ends of the partition walls, the connecting portions functioning as pressing portions for moving the IC supporting platform downward, the other partition walls being left in a non-interconnected state.

Due to the foregoing arrangement, the connecting portions which function as pressing portions for moving the IC supporting platform and the partition walls can be properly molded, and the pressing object of the IC supporting platform utlilzing the partition walls can be achieved with ease while effectively achieving the object for aligning the contacts by the partition walls.

Also, by making the end portions of most portions of the partition walls in a non-interconnected state, the assembling of the contacting portions of the contacts of micro pitches with the IC supporting platform becomes very easy.

DETAILED DESCRIPTION OF THE EMBODIMENT

Figure 1:
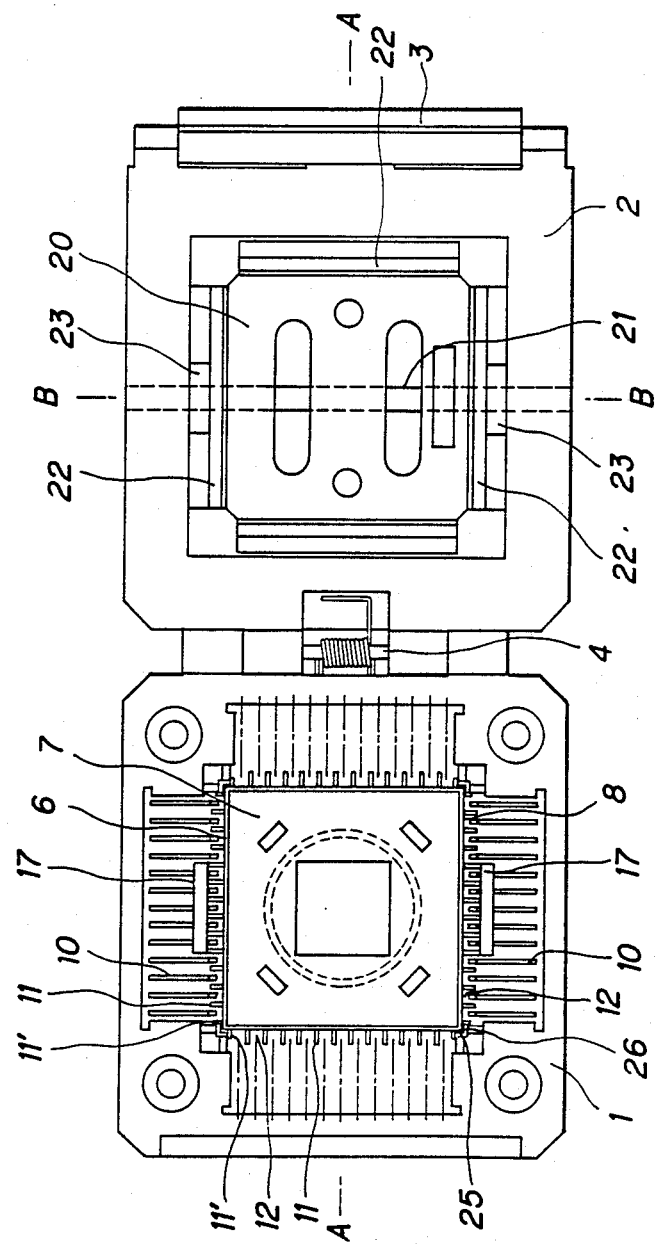
FIG. 1 illustrates a plan view of an IC socket of an embodiment of the present invention in which the IC pressing cover is in an open state.
Figure 2:
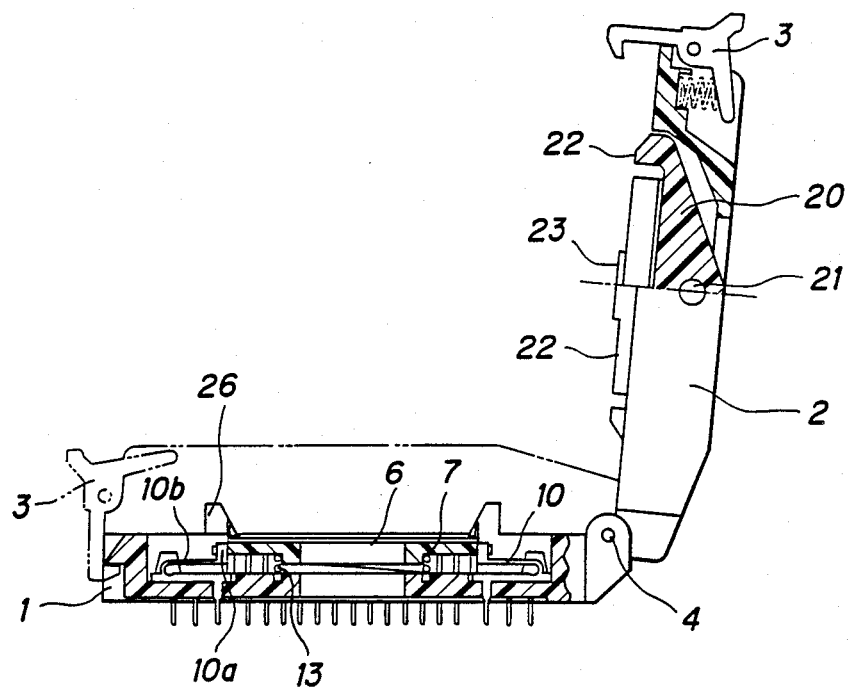
FIG. 2 illustrates a side view of the IC socket along section line A—A shown in FIG. 1.
Figure 3:
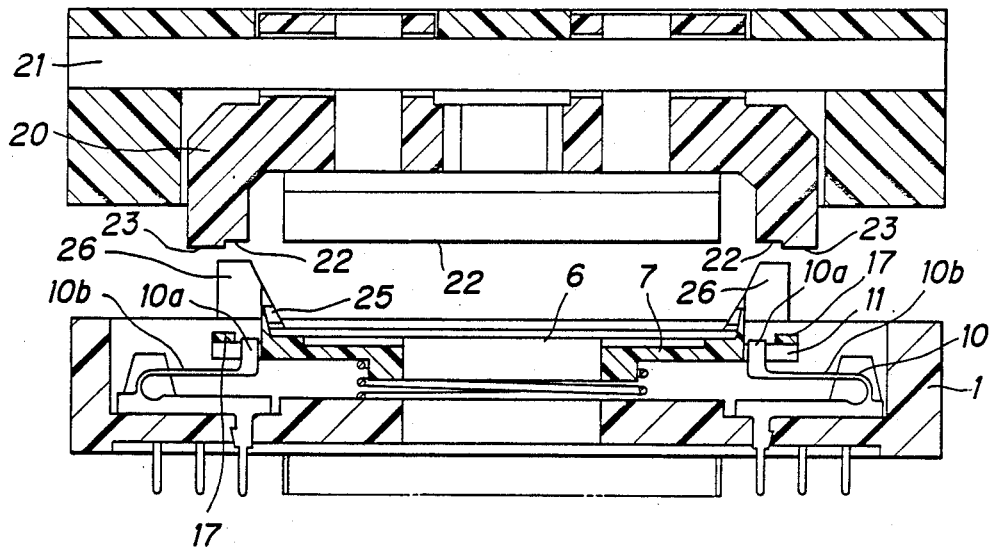
FIG. 3 illustrates a sectional view of the IC socket along section line B—B shown in FIG. 1.

The embodiment of the present invention will be described with reference to FIGS. 1 through 6.

Reference numeral 1 denotes a socket board fromed on a square insulating board. The socket board 1 has an IC accommodating space 6 corresponding to an IC package 15, and contacts 10 corresponding to IC leads 16 of the IC package 15.

The socket board 1 has a square window formed in a central portion thereof as th IC accommodating space 6, and an IC supporting platform 7 is disposed in the IC accommodating space 6 and is movable in an upward and downward direction. The IC supporting platform 7 has contacts arranged on four or two side of its outer periphery.

The IC supporting platform 7 is resiliently supported by a spring 13 for exerting an upward force. The IC supporting platform 7 is moved downward against the spring 13 and moved upward in accordance with the spring 13.

In order to mount the IC supporting platform 7 on the socket board 1 in such a manner as to provide upward and downward movwement, for example, the supporting platform 7 is provided with an engaging leg extending downward from the lower surface of the supporting platform 7, and the engaging leg is inserted into an engaging hole of the socket board 1 in such a manner to be able to move upward and downward. The engaging leg is engaged with a marginal portion of the engaging hole to serve as an upward dead point, and the supporting platform 7 is supported on the engaging hole defining wall to serve as a downward dead point.

The contacts 10 are planted or embedded in the socket board 1 of the outer peripheral portion of the IC supporting platform 7 and have resilient contacting pieces 10b extending toward each side of the IC supporting platform 7 from the planting or embedding portion. The resilient contacting pieces 10b are provided with a resilient displacing function directed in the vertical direction and have on a free end thereof a contacting portion 10 projecting upward. The contacting portion 10a is located on the peripheral portion of the IC supporting platform 7.

Opposing sides of the constructed IC supporting platform 7 are provided with a plurality of partition walls 11 projecting from the side surfaces of the supporting platform 7 and a plurality of positioning grooves 12 are formed between every adjacent partition wall 11.

The positioning grooves 12 have the same pitch as the contacts 10 and the IC leads 16 and receive therein the contacting portions 10a of the resilient contacting pieces 10b and by regulating the partition wall 11, correct positioning is effected.

In other words, each partition wall 11 is interposed for isolation between the every adjacent contacting portion 10a.

Among the constructed partition walls 11 on each side of the IC supporting platform 7, one portion of the partition walls of at least two opposite sides are interconnected at free ends thereof, and such connecting portions 17 function as pressing portions fro moving the IC supporting platform 7 upward and downward. By exerting a downward force to the connecting portions 17 as the pressing portions, the IC supporting platform 7 is moved downward against the spring 13. The IC supporting platform is moved upward in accordance with the spring 13 by removal of the downward force.

The positioning grooves 12 on each side are closed to form holes at the portion where the connecting portions 17 are disposed, and the other positioning grooves 12 are all opened at free ends thereof.

On the other hand, the IC pressing cover 2 is pivotally supported by a pivot shaft 4 on one side of the socket board, and the IC pressing member 20 is axially supported by a shaft 21 on the inner surface of the IC pressing cover 2 in such a manner as to be able to effect a lever motion. Both swinging ends are provided with the IC lead pressing portions 22 integrally projecting in such a manner as to correspond to the row of the IC leads 16 on each side, and pressing portions 23 of the IC supporting platform 7 corresponding to the connecting portions 17 are integrally projected from the pressing portions 22 of the IC leads.

Preferably, the IC pressing member 20 is pivotally supported by the shaft 21 which is disposed in parallel to with the pivot shaft 4 of the IC pressing cover 2.

Figure 4:
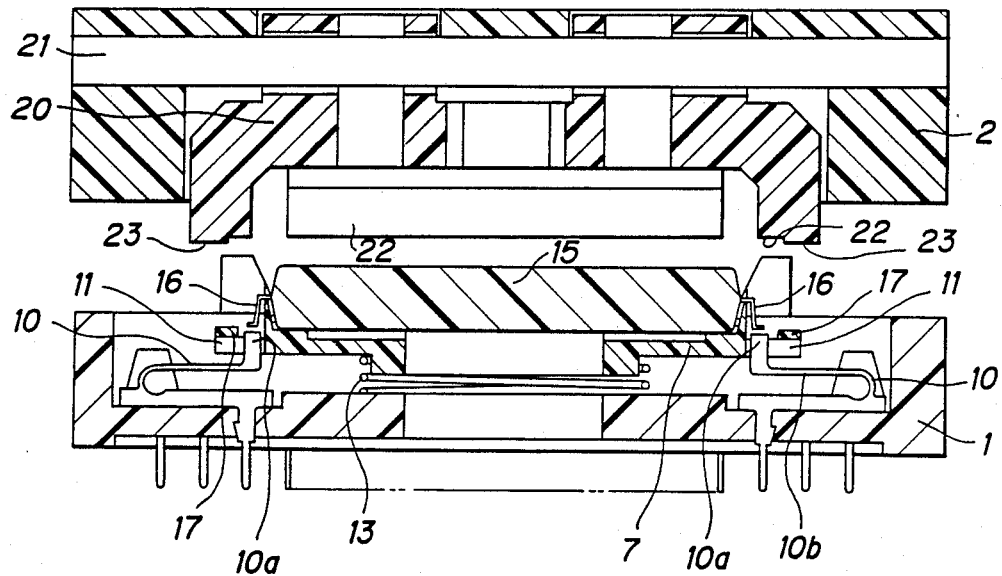
FIG. 4 illustrates a sectional view shown in the IC socket of FIG. 3 with an IC package placed thereon.

As is shown in FIG. 4, the IC package 15 is placed on the IC supporting platform 7, and the inner portions of the IC leads 16 projecting from the side of the IC package 15 are supported by lead supporting walls 8 erected on the peripheral portion of the IC supporting platform 7.

At this time, the end portions of the IC leads 16 and the contacting portions 16 of the contacts 10 are vertically spaced apart and placed in a corresponding state.

Figure 5:
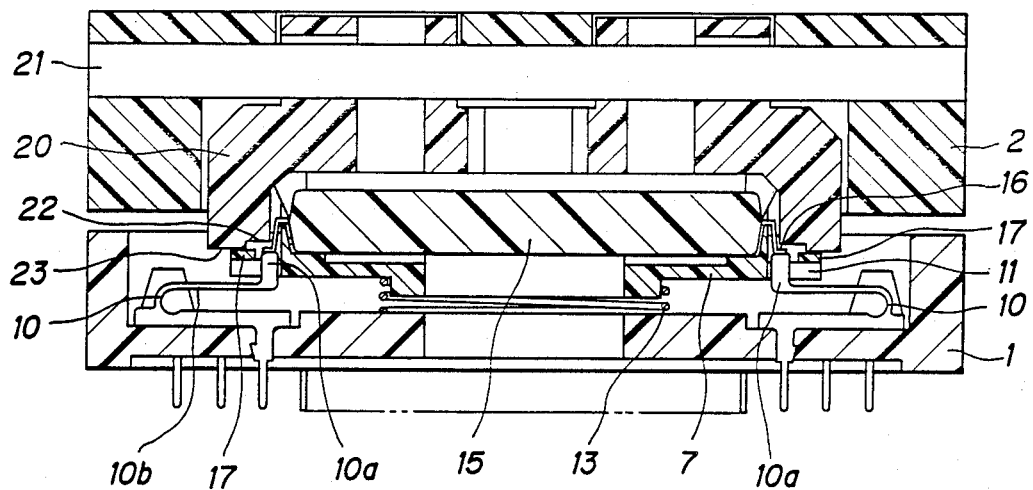
FIG. 5 illustrates a sectional view shown in the IC socket of FIG. 4 in which the IC pressing cover is closed to press the connecting portions.
Figure 6:
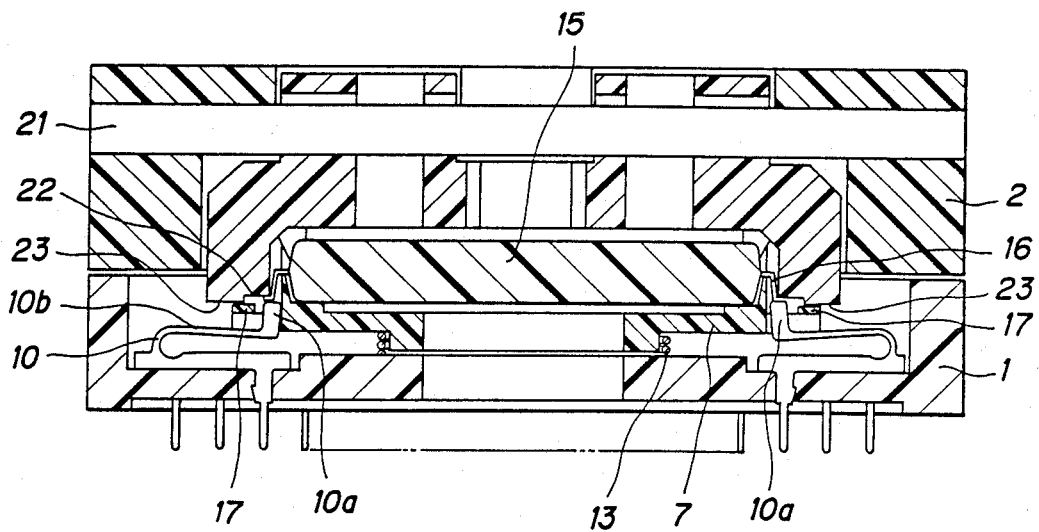
FIG. 6 illustrates a sectional view of the IC socket in which the closing state of the IC of the pressing cover is further progressed to press the IC leads.

Next, as is shown in FIG. 5, when the first IC pressing cover 2 is closed, the pressing portion 23 first presses the connecting portions 17 before the IC leads press the connecting portions 17 to exert a downward force to the IC supporting platform 7 in order to cause it to move downward. Then, when the closed state of the pressing cover 2 is further progressed, the pressing portion 22 follows to press the end portions of the IC leads 16. While holding the leads 16 between the pressing portion 22 and the contacting portion 10a in a sandwich fashion, the resilient contacting pieces 10b are bent downward against the resiliency. As a result, a pressure contact is obtained by restoring force of the resilient contacting pieces 10b. In this state, a lock member 3 mounted on the free end of the IC pressing cover 2 is engaged with the end portion of the socket board 1, thereby holding the above-mentioned contacted state.

The IC pressing member 20 effects a lever motion to match the pressing timing of the pressing portions 22 and 23.

Furhtermore, the IC supporting platform 7 is provided on its corner portions with a projection 25 having a hook shaped guide surface, and the socket board 1 is provided on corner portions of the IC accommodating space 6 with a projection 26 having a hook shaped guide surface. Then the hook shaped guide surface of the projection 25 is fitted snugly to the hook shaped guide surface of the projection 26, and the partition wall 11 of the row end of each side is disposed along the side surface of the projection 26 in order to guide the vertical movement of the IC supporting platform 7.

As described in the foregoing, according to the present invention, one portion of the partition walls of at least two opposite sides are interconnected to form pressing portions and the other partition walls are all left in an opened state. Accordingly, the connecting portions as pressing portions for moving the IC supporting platform downward and the partition walls can be properly molded. While favorably maintaining the function of the partition walls for aligning the contacts, the connecting portions are formed utilizing the partition walls. The invention can also effectively achieve its object of using the connecting portions as a means for pressing the IC supporting platform.

Furthermore, by leaving the end portions of most of the partition walls in a non-interconnected state, assembling of the contacting points of the contacts of micro pitches becomes very easy.

The present invention has been described with reference to a preferred embodiment. However, it will be appreciated that variations and modifications can be effected within the ordinary skill in the art without departing from the scope of the invention.

What is claimed is:

1. An IC socket comprising a socket board having a plurality of contacts for contacting IC leads and an IC accommodating portion formed in a central portion thereof, and an IC supporting platform adapted to support an IC package thereon and disposed in said acccommodating portion in such a manner as to be able to move upward and downward, said contacts being formed in parallel relation along opposing sides of said supporting platform, a plurality of grooves for positioning said contacts being formed in a parallel relation in opposing sides of said IC supporting platform, contacting portions of resilient contacting pieces of said contacts being received in said positioning grooves, said resilient contacting pieces being regulated by partition walls defining said positioning grooves, said IC socket being characterized in that among partition wall groups formed on four sides, one portion pf partition wall groups of at least two opposite sides are interconnected at free ends of said partition walls, said connecting portions functioning as pressing portions for moving said IC supporting platform downward, other partition walls being left in a non-interconnected state.

2. An IC socket as claimed in claim 1, wherein said pressing portions are formed by interconnecting said partition walls at a central portion among said partition wall groups.

* * * * *